US007358771B1

(12) United States Patent
Talbot

(10) Patent No.: US 7,358,771 B1
(45) Date of Patent: Apr. 15, 2008

(54) SYSTEM INCLUDING A SINGLE ENDED SWITCHING TOPOLOGY FOR HIGH-SPEED BIDIRECTIONAL SIGNALING

(75) Inventor: Gerald R. Talbot, Concord, MA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 73 days.

(21) Appl. No.: 11/368,787

(22) Filed: Mar. 6, 2006

(51) Int. Cl.
H03K 19/0175 (2006.01)
(52) U.S. Cl. .................. 326/82; 326/30; 326/33; 326/87; 327/109; 327/312
(58) Field of Classification Search ............ 326/26–27, 326/30, 33; 327/108–109, 309, 312
See application file for complete search history.

(56) References Cited

U.S. PATENT DOCUMENTS

| 5,254,883 | A |   | 10/1993 | Horowitz |         |
|-----------|---|---|---------|----------|---------|
| 5,552,739 | A | * | 9/1996  | Keeth et al. | 327/538 |
| 5,831,467 | A | * | 11/1998 | Leung et al. | 327/319 |
| 6,347,029 | B1 | * | 2/2002  | Ouyang et al. | 361/93.9 |
| 6,369,605 | B1 | * | 4/2002  | Bonella et al. | 326/30 |
| 6,529,037 | B1 | * | 3/2003  | Haycock et al. | 326/30 |
| 6,608,507 | B2 |   | 8/2003  | Garrett  |         |
| 6,615,301 | B1 | * | 9/2003  | Lee et al. | 710/106 |
| 6,643,787 | B1 |   | 11/2003 | Zerbe    |         |
| 6,870,419 | B1 |   | 3/2005  | Garrett  |         |
| 2002/0084824 | A1 | * | 7/2002 | Cohn et al. | 327/309 |

* cited by examiner

Primary Examiner—Rexford Barnie
Assistant Examiner—Jason Crawford
(74) Attorney, Agent, or Firm—Meyertons Hood Kivlin Kowert & Goetzel, P.C.; Stephen J. Curran

(57) ABSTRACT

A system including a single ended switching topology for high-speed bidirectional signaling includes a device coupled to a plurality of bidirectional signal paths. The device includes a plurality of voltage mode driver circuits, each coupled to a respective signal path. Each of the driver circuits may source a voltage when transmitting data and terminate a respective signal path to a ground reference when receiving data. The device also includes a shunt regulator circuit coupled to a voltage supply of the device. The shunt regulator may provide a current shunt from the voltage source to the ground reference in response to detecting a transition on the voltage supply in which the voltage increases above an average DC voltage.

17 Claims, 7 Drawing Sheets

SYSTEM INCLUDING A SINGLE ENDED SWITCHING TOPOLOGY FOR HIGH-SPEED BIDIRECTIONAL SIGNALING

BACKGROUND OF THE INVENTION

1. Field of the Invention

This invention relates to communication links and, more particularly, to communication over bidirectional links.

2. Description of the Related Art

In high-speed bidirectional signaling schemes, various issues may arise that may degrade performance. For example, simultaneous switching outputs (SSO) may cause noise to be coupled through the on-die voltage supply (VDD). In addition, SSO may cause voltage sag on VDD the when output drivers switch. This voltage sag may also be present on the data paths, which may also cause undesirable effects. Accordingly, to allow transfers to occur at high data rates, it may be desirable to reduce on-die noise and voltage variations in the on-die supply voltage.

SUMMARY

Various embodiments of a system including a single ended switching topology for high-speed bidirectional signaling are disclosed. In one embodiment, the system includes a device coupled to a plurality of bidirectional signal paths. The device includes a plurality of voltage mode driver circuits, each coupled to a respective signal path. Each of the driver circuits may source a voltage when transmitting data and terminate a respective signal path to a ground reference when receiving data. The device also includes a shunt regulator circuit coupled to a voltage supply of the device. The shunt regulator may provide a current shunt from the voltage source to the ground reference in response to detecting a transition on the voltage supply in which the voltage increases above an average DC voltage.

Figure 1:
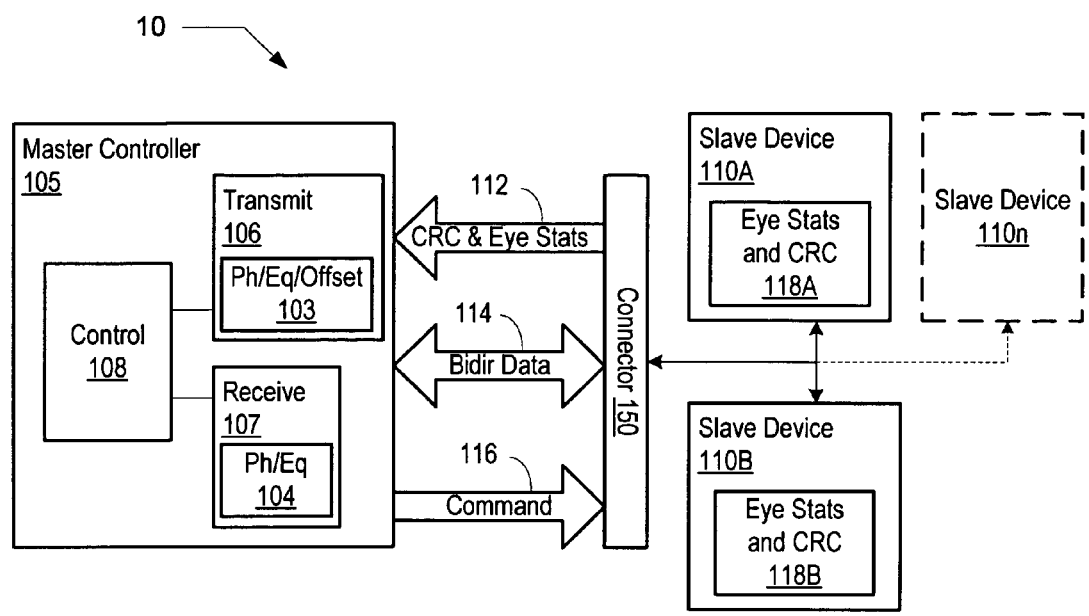
FIG. 1 is a block diagram of one embodiment of a system including asymmetric control of bidirectional data transfer.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. It is noted that the word "may" is used throughout this application in a permissive sense (i.e., having the potential to, being able to), not a mandatory sense (i.e., must).

DETAILED DESCRIPTION

Turning now to FIG. 1, a block diagram of one embodiment of a system including asymmetric control of bidirectional data transfer is shown. System 10 includes a master controller 105 coupled to slave devices 110A through 110$n$ via a plurality of signal paths and a connector 150. As shown, the signal paths include bidirectional (bidir) data paths 114, command paths 116, and cyclic redundancy code (CRC) and eye statistic information paths 112. It is noted that slave device 110$n$ is meant to illustrate that any number of slave devices may be used. It is also noted that components that include a reference designator having a number and a letter may be referred to by the number only. For example, slave device 110A may be referred to as slave device 110 where appropriate.

In the illustrated embodiment, master controller 105 includes a transmit unit 106, a receive unit 107, and a control unit 108 that is coupled to both transmit unit 106 and receive unit 107. In one implementation, system 10 may be an example of a memory subsystem. As such, master controller 105 may be a memory controller and slave devices 110A-110$n$ may be memory devices such as devices in the dynamic random access memory (DRAM) family of memory devices, for example. As such, connector 150 may be a connector such as may be found on a memory module that includes a plurality of memory devices such as slave devices 110. In addition, command paths 116 may convey address and control information, and the bidirectional data paths 114 may convey data in both directions. CRC and eye stats paths 112 may convey CRC information from slave 110 to master controller 105. As described in greater detail below in conjunction with the description of FIG. 2, CRC and eye stats paths 112 may also convey data signal phase information generated by slave device 110. It is noted that in general, system 10 may be representative of any type of system that employs bidirectional data paths.

In one embodiment, CRC and eye stats path 112 may include two signal paths, although any number of signal paths may be used. The bidirectional data paths 114 may include a number of eight-bit (byte-wide) data paths. For example, the full data path may be 64 bits wide, but the data path may be divided into byte-sized portions, the full data path may include any number of data bits, and be divided into different sized portions.

As mentioned above, many conventional systems control high-speed bidirectional communication by implementing control functions such as clock phase recovery, channel equalization, error detection, for example, in both communicating devices. However, as described in greater detail below, slave device 110 may be simplified. As such, master controller 105 may include control functionality that may dynamically and adaptively adjust the signal characteristics (e.g., phase and equalization, and voltage offset, etc.) of transmitted data to enable slave device 110 to correctly read the data based upon information received from slave device 110. In addition, master controller 105 may adjust the internal receiver characteristics to enable master controller 105 to receive data sent by slave device 110.

More particularly, at high data rates the uncertainties of delays in the transmission path for different signals in a bus require a per bit phase adjustment of a sample clock of the receiver. To avoid employing this circuitry in slave device 110, master controller 105 may adjust the phase of its transmitted signal to align with the sample clock generated inside the slave device, thus avoiding complex phase shifting circuits in the slave.

Thus, transmit unit 106 receives information from slave device 110 that may be used to adjust its transmit phase. As such, slave device 110 may include eye statistics and CRC generation logic 118 that may accumulate statistics about the edge position of data transitions using a phase detector (shown in FIG. 2) that is sometimes referred to as a "bang-bang phase detector." The early/late signals from this detector may be integrated and sent to master controller 105 via the uni-directional CRC signal paths 112. In one implementation, slave device 110 may send this information to master controller 105 for each received "bit lane" or data path.

In addition, at high data rates the probability of a slave device 110 or master controller 105 receiving a bit error is significant. Accordingly, it may be necessary to protect transfers with an error detection code that will robustly detect multiple bit errors within a protected block. When an error is detected on the link in either direction master controller 105 may correct the error by retrying the operation.

Figure 2:
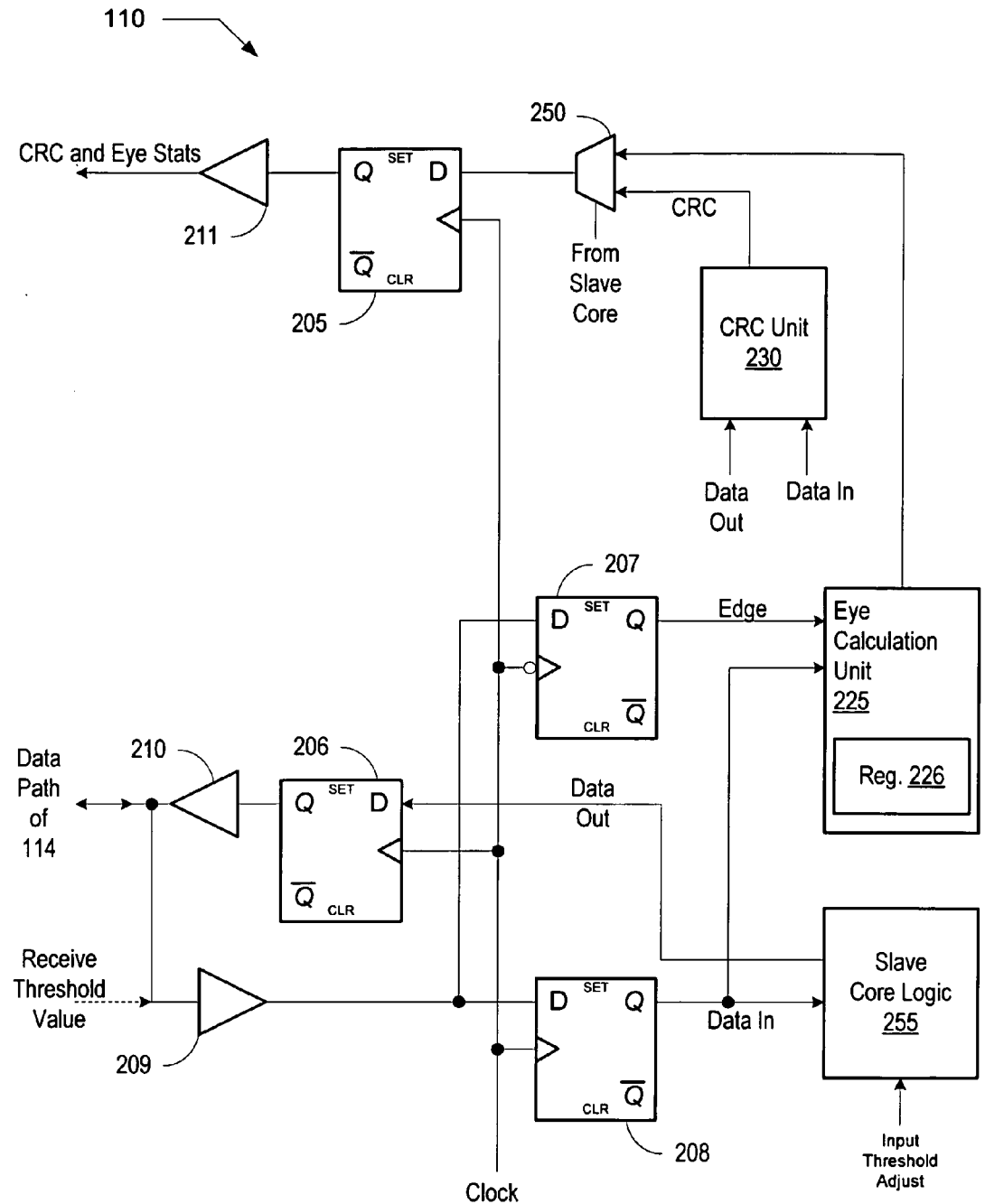
FIG. 2 is a diagram illustrating more detailed aspects of one embodiment of the slave device of FIG. 1.

In one embodiment, a CRC code may be used to provide multiple bit error detection. More particularly, as shown in FIG. 2, to simplify the logic in the slave device and reporting of errors to master controller 105, slave device 110 calculates a CRC based on either the data it is generating or the data that it is receiving. Accordingly, to transfer the CRC information back to master controller 105 one or more uni-directional CRC signal paths 12 may be used. As shown in FIG. 2, CRC generation unit 230 which calculates the CRC based on its internal data, and sends the CRC data back to master controller 105.

In one embodiment, the CRC information may be calculated and sent in parallel with the data on a transfer from slave device 110 to master controller 105 so that the CRC may be available at the same time as the data block it is protecting when it reaches master controller 105.

It is noted that on a transfer from master controller 105 to slave device 110 there will be some inherent delay from slave device 110 receiving the data internally, calculating the CRC and sending it to the master controller 105. However, as described further below in conjunction with the description of FIG. 5, this delay may be overlapped with a gap that is inserted on the data bus on a write-to-read and read-to-write bus transition.

Referring to FIG. 2, a diagram illustrating more detailed aspects of one embodiment of the slave device of FIG. 1 is shown. Slave device 110 includes logic 118 which includes a data input buffer 209 that is coupled to one signal path of bidir data paths 114 and to an input of a flip-flops (FF) 208. The output of FF 208 is coupled to slave core logic 255. A data out signal from slave core logic 255 is also coupled to an input of FF 206. The output of FF 206 is coupled to a data output buffer which is coupled to the same signal path. The input of FF 207 is also coupled to the signal path of bidir data paths 114. The output of FF 207 is coupled to eye calculation unit 225. The output of eye calculation unit 225 is coupled to one input of a multiplexer 250. The data in and data out signals are also coupled to a CRC unit 230, the output of which is in turn coupled to the other input of multiplexer 250. The output of multiplexer 250 is coupled to the input of FF 205. The output of FF 205 is coupled to a buffer 211, which is coupled to one signal path of CRC and eye stats signal paths 112. A slave sample clock signal is coupled to each clock input of FF 205-208.

In the illustrated embodiment, FF 207 and FF 208 sample the analog voltage signal at the output of buffer 209 at the edge and center of the data signal, respectively. These two samples are the inputs to eye calculation unit 225, which may calculate various statistics about the received data eye. To adjust the phase of the data transmitted by master controller 105, every edge transition may be accumulated in a counter/register 226 within eye calculation unit 225. In one implementation, early and late edges increment and decrement register 226, respectively, which may provide a scaled index for the phase of the transmit data. As described further below, additional statistics may also be accumulated to adjust transmitter equalization and input receiver offset adjustment of master controller 105.

In one embodiment, the phase information accumulates for each data bit transition received. This phase information may be accumulated over a 16-bit burst on a per data path basis. Register 226 may be a 4-bit counter that may be incremented or decremented depending on the transition being late or early. Slave device 110 may send a single bit per data path back to master controller 105 per 16-bit burst to indicate whether the 4-bit counter value is positive or negative. After receiving the transition error information, control unit 108 may further integrate this transition information to control the phase of the transmitted data. As such, transmit unit 106 may adjust or modify the phase of the transmitted data until slave device 110 is locked to the data.

As mentioned above, master controller 105 may adjust receiver circuitry to correctly receive the data sent by slave device 110. In one embodiment, receive unit 107 includes sample clock adjustment logic 103 that may include a bang-bang phase detector similar to the phase detector shown in FIG. 2. As such, when master controller 105 is receiving data from slave device 110, receive unit 107 may use the bang-bang phase detector to adjust its own local sample clock to more optimally receive data transmitted by slave device 110. This is described in more detail below in conjunction with the description of FIG. 3.

In addition to phase adjustment of the transmitted data and adjustment of the receive sample clock within receive unit 107, it may be necessary to equalize data path channels. More particularly, due to the high frequency loss of the channel and/or reflections that may be caused by multiple slave devices 110 attached to the same channel (as shown in FIG. 1), data paths may need to be equalized. Equalization of the data paths may optimize the eye opening in the receiver logic of slave device 110. Accordingly, in one embodiment, transmit unit 106 includes a phase and equalization unit 103, which employs a finite impulse response (FIR) filter having a plurality of coefficients to drive its output digital-to-analog converter stage.

In one embodiment, the coefficients for the FIR filter may be trained or adaptively modified to the characteristics for each individual data path. To allow the transmit unit 106 to adjust its equalization, master controller 105 receives from slave device 110 error information that corresponds to the ISI that is seen at each input of slave device 110.

To simplify or reduce the logic needed within slave device 110, equalizer unit 103 within transmit unit 106 may also use the logic 118 within slave device 110 that samples data phase to determine how well it is equalizing the channel. To enable slave device 110 to generate an error value of the received eye amplitude, master controller 105 sends commands to slave device 110 that may cause slave device 110 to change its input receive threshold by some offset amount. This offset may be chosen such that on a correctly equalized channel, there may be approximately a 50% error rate, and deviation from this 50% error rate may indicate to master controller 105 an error in the equalization it is performing within transmit unit 106. Alternatively as shown in FIG. 2, master controller 105 may provide a receive threshold value by supplying it directly to slave device 110 via another signal path in the interface.

In one implementation, master controller 105 may transmit blocks of 16 bits, and slave device 110 reports the value sampled for the 15$^{th}$ bit of this current 16-bit block. Master controller 105 may transmit random data for all of the data bits in this block except for the 15$^{th}$ bit, which may be a predetermined value chosen to match the offset value that slave device 110 is using within its receiver. Since master controller 105 knows what data values it is transmitting, it can use these data values on a per coefficient basis to adjust each coefficient's value depending on the sign of the error bit returned by slave device 110. The transmit coefficients are then trained using an algorithm such as the sign-sign LMS adaptation algorithm, for example. The number of coefficients to be trained may be a function of the length of the tail of the channel's pulse response.

In one implementation, master controller 105 may use a four tap decision feedback equalizer (DFE) to correct a pulse response that includes nulls in the channel's transmission response that may include reflections due to the slave device stubs caused by the multi-drop data bus. However, it is contemplated that in other embodiments other numbers of taps may be used to cover, for example, any reflections that may be caused by a round trip of the channel.

Figure 3:
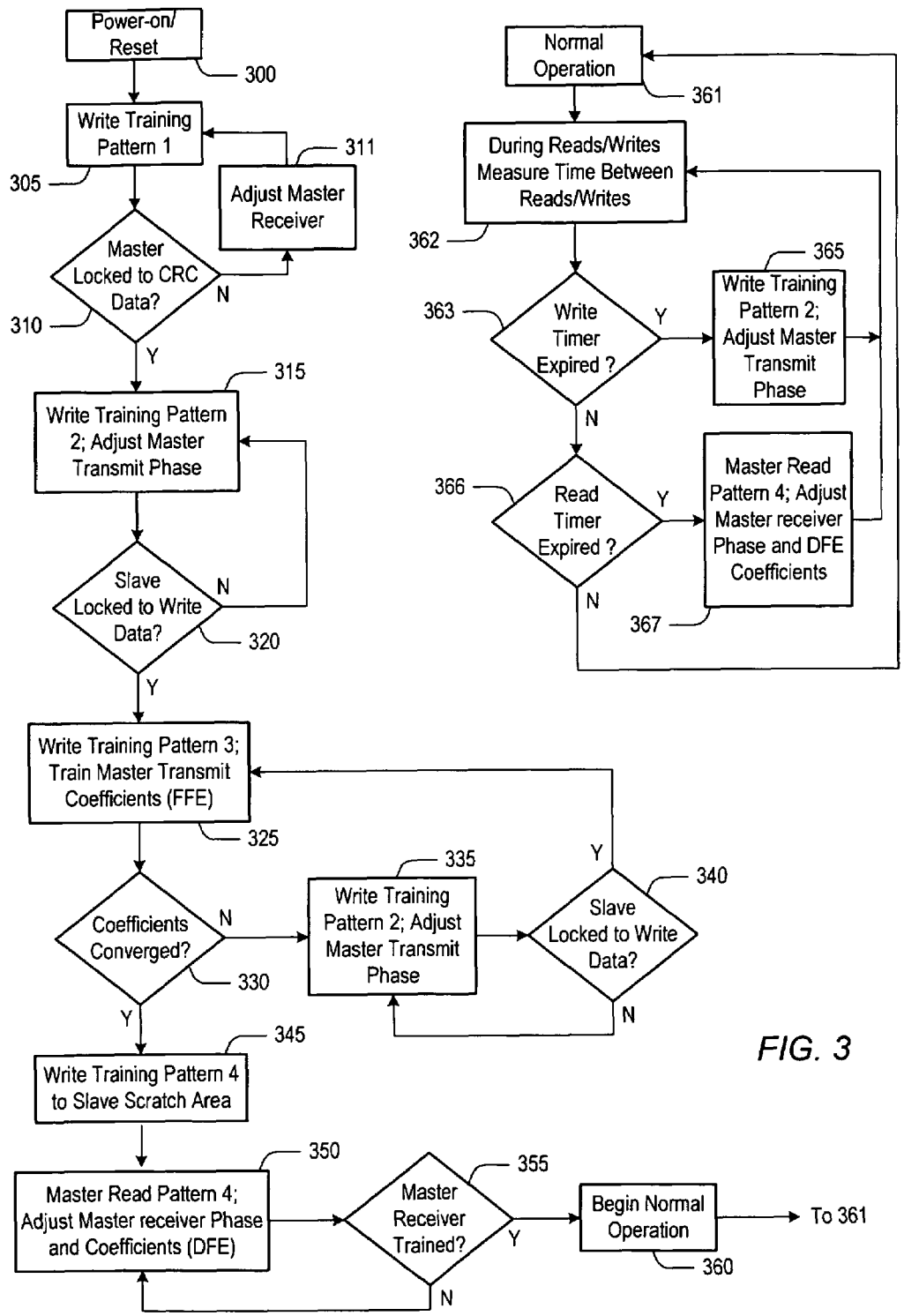
FIG. 3 is a flow diagram describing the operation of the embodiments shown in FIG. 1 and FIG. 2.

FIG. 3 is a flow diagram describing the operation of the embodiments shown in FIG. 1 and FIG. 2. More particularly, as described above, the master controller may be configured to adaptively modify its transmit and receive characteristics such that it may transmit data that may be received correctly by the slave device, and it may correctly receive the data sent by the slave device.

Referring collectively to FIG. 1 through FIG. 3 and beginning in block 300 of FIG. 3, after a reset or power-on condition, the receive unit 107 of master controller 105 may be trained to receive at least the two data paths of the CRC paths 112. Accordingly, master controller 105 writes a known first training pattern to a predetermined location within slave device 110 (block 305). In response to the write, slave device 110 generates and sends a CRC based upon the received data via CRC paths 112. Master controller 105 receives the CRC and determines if the receive unit 107 is locked to the CRC data (block 310). If the master is not locked to the CRC data, control unit 108 may cause the phase and equalization for the receive unit 103 to be adjusted (block 311) and the write pattern to be resent (block 305).

When master controller 105 determines that the receive unit 107 is locked to the CRC data (block 310), master controller 105 attempts to train the transmit unit 106 to send data that the slave device 110 can correctly receive. More particularly, master controller 105 sends a second training pattern to slave device 110 (block 315). In one implementation, the second training pattern may be a pattern that may not need the data paths to be equalized. For example, a pattern such as 11001100b may be used. Based upon the CRC data and edge statistics received from slave device 110, master controller 105 determines whether the slave device 110 is correctly locked to the write data (block 320). If the master controller 105 determines that the slave is not locked to the data, control unit 108 may cause the phase of the transmitted data to be adjusted, and the pattern to be resent (block 315).

If however, the CRC and eye statistic information indicates that the slave device 110 is locked to the transmitted data (block 320), master controller 105 may attempt to equalize the data paths of bidir data paths 114. In one embodiment, master controller 105 sends a third training pattern to slave device 110 (block 325) via bidir data paths 114. In one implementation, the third pattern may be a more randomized pattern. Once again, based upon received CRC data, master controller 105 may determine if the coefficients of a multiple tap feed forward equalizer (FFE) are converged (block 330). In addition, the phase alignment of the transmitted data may move during the adjustment of the coefficients, thus the phase may also be rechecked and adjusted using training pattern two (blocks 335 and 340). Thus as shown, master controller 105 may adapt the coefficients and track the phase iteratively until both the coefficients have converged, and the transmitted data phase is aligned (block 330).

Once the transmit data phase has been aligned and the transmit data paths have been equalized, the characteristics of receive unit 107 may be adjusted and trained to reliably receive data on the bidir data paths 114. Accordingly, master controller 105 transmits a fourth pattern to be stored to a storage location (not shown), for example, within the slave device 110 (block 345). Master controller 105 performs a subsequent read of the fourth pattern from slave device 110. Since the pattern is known, control unit 108 may cause the phase and equalization of receive unit 106 to be adjusted to reliably receive the data sent from slave device 110 (block 350). If master controller 105 determines the receiver is not trained (block 355), master controller 105 may initiate further reads of the pattern data, and further adjustment may be made (block 350). Once the receive unit 106 has been trained, system 10 may begin normal operations, during which master controller 105 may perform reads and writes to slave device 110.

Proceeding to block 361, during normal operation of system 10, the phase may drift. The phase alignment may be continually checked by master controller 105 as long as there are reads and writes occurring and data being transferred on the data paths. However, large gaps in bus traffic may allow the phase to drift undetected. As such, if there is a gap in the reads and writes that exceeds a predetermined amount of time, master controller 105 may initiate dummy write and read cycles to keep the phase of the transmit unit 106 and receive units 107 trained.

More particularly, in one embodiment, control unit 108 may measure the time elapsed between consecutive reads and between consecutive writes (block 362) using timers, for example. If the write timer expires (too much time elapses between two writes) (block 363), control unit 108 may cause one or more dummy write cycles to occur which includes writing the second training pattern to slave device 110. Based upon the CRC and eye statistics received, control unit 108 may cause the phase of transmit unit 106 to be adjusted (block 365).

Similarly, if the read timer expires (too much time elapses between two reads) (block 366), control unit 108 may cause one or more dummy read cycles to occur which includes reading the fourth training pattern from slave device 110. Control unit 108 may cause the phase of receive unit 107 to be adjusted (block 367). Once trained or checked, operation may proceed normally as in block 361. It is noted that in other embodiments, master controller 105 may initiate the dummy read and write cycles dependent upon factors other than elapsed timers. For example, master controller 105 may initiate retraining of the transmit unit 106 and receive unit 107 based upon error rates of received data or CRC bits.

Slave Device Input Offset Correction

By changing the polarity of the offset used in the receiver of slave device 110, master controller 105 may determine whether there is any bias in the error rate for a logic 1 versus a logic 0 as sampled in the 15$^{th}$ bit of a 16-bit burst. This bias may indicate an input offset in the receiver of slave device 110. Master controller 105 may compensate for the offset by shifting its transmitted waveform up or down. In one implementation, transmit unit 106 may correct up to +/−50 mV of a slave device receiver's input offset.

Data Scrambling

When transferring data at high data rates via a lossy channel, some data patterns have a higher probability of generating bit errors than others. In addition, most channels of interest consist of multiple parallel wires which can exhibit significant crosstalk between the data paths in the bus. This crosstalk can be generated by coupling between parallel conductors on a printed circuit board, coupling in via arrays, connectors, packages, sockets, and the like. Similarly, in the case of a single ended switching system, crosstalk may be a result of multiple outputs switching simultaneously.

Figure 4:
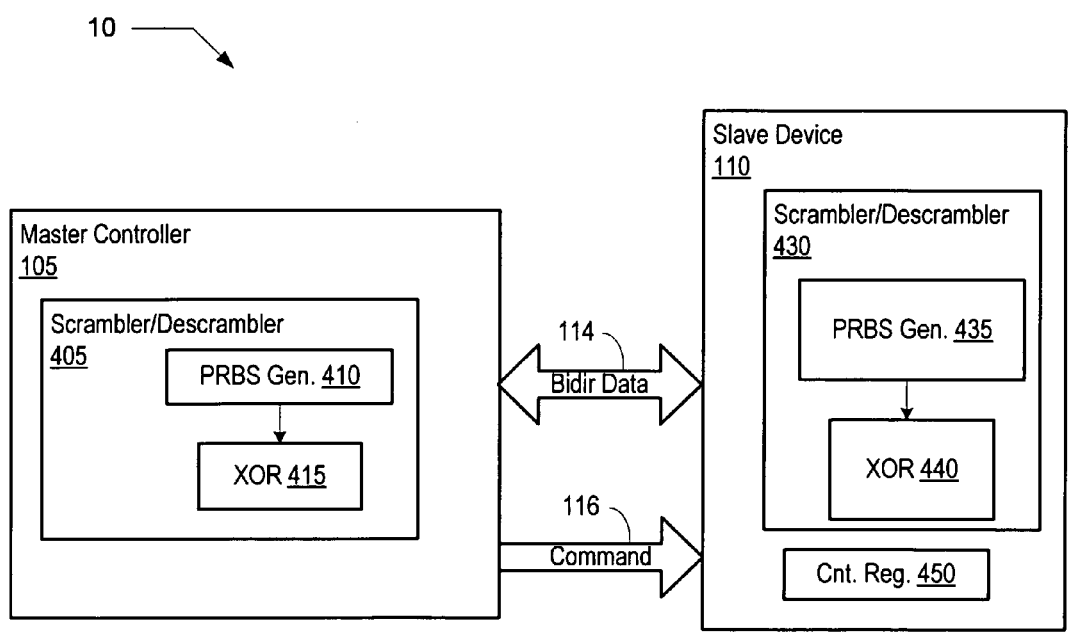
FIG. 4 is a block diagram that illustrates additional details of the embodiment of the system of FIG. 1 including scrambling and de-scrambling logic.

Referring to FIG. 4 a block diagram that illustrates one embodiment of the system of FIG. 1 including scrambling logic is shown. It is noted that in addition to the functionality described below, master controller 105 of FIG. 4 may include all the functionality of master controller 105 of FIG. 1. Likewise, slave device 110 of FIG. 4 may also include all the functionality of slave device 110 of FIG. 1. However, for simplicity, that functionality is not duplicated here. Since the data to be transferred is not guaranteed to be random there is a possibility that a pathologically bad data pattern may be transferred on a victim line and its significant aggressors. To avoid this causing an undesirable increase in the bit error rate of the link, the data on each path may scrambled. In one implementation, the data may be combined with an output of a pseudo random binary sequence (PRBS) using an exclusive-OR (XOR) function.

In one embodiment, master controller 105 and slave device 110 may include identical PRBS generators which may be initialized to a same sequence during training via PRBS synchronization a command sent by the master controller 105. Depending on direction of data flow, one end of the link scrambles the data with the known PRBS and the other de-scrambles it with its local PRBS generator. Accordingly, master controller 105 includes a scrambler/descrambler 405 that includes a PRBS generator 410 that is coupled to an XOR block 415. Similarly, slave device 110 includes a scrambler/descrambler 430 that includes a PRBS generator 435 that is coupled to an XOR block 440.

To avoid correlation between data paths, each path may be scrambled with a different PRBS, thereby effectively smearing out, in the frequency domain, any pathologically bad crosstalk data patterns and allowing their effects to be evaluated statistically with normal distributions. Scrambling the data may also help to ensure that the data patterns that are generated are spectrally white in the frequency domain so that the LMS adaptation algorithm will not have any biased statistics for any of the tap coefficients that it may be adapting.

In embodiment, to minimize the implementation cost, each of the PRBS generators 410 and 435 may be implemented from a master PRBS generator that includes multiple taps. A different generator tap may be XORed with data from each data path to generate a non-overlapping PRBS per path. The choice of taps may be made to maximize the difference between the sequences used on each path.

In embodiments in which slave device 110 may be a memory device, data may be stored in the scrambled state, thus avoiding the cost of implementing scrambling in the memory devices. To ensure that master controller 105 can decode the scrambled data, a scrambling seed may be calculated from a hash of the storage address of the data, thus the data transferred over the bus may remain statistically random even for the case of frequently occurring sequential memory access patterns.

In one implementation, a hash of the address may be generated by pre-loading the scrambler PRBS with the address of the block to be accessed and then shifting the PRBS generator by some fixed number of stages, thereby randomizing the address to create a unique seed for each block of data transferred to and from the memory. It is noted that in a system that uses critical word order, additional care may be taken to ensure that the de-scrambling takes into account the wrapping that will occur when the first address access does not occur on a block boundary. In such cases, an appropriately wrapped scramble pattern may be computed for that block of data.

It is also noted that when storing scrambled data in memory devices, access to memory device control registers would not naturally be scrambled. As such, it may be desirable to ensure that the control information transfers also behave as random data by appropriately defining the sense of the memory device control register bit values to minimize the likelihood of the pathologically bad data patterns. For example, the memory device control register 450 bit definitions may be changed form default definitions such that a logic one may mean one thing in one bit location while it might mean the opposite in another location. Accordingly, the bits having the same logic value may be distributed to appear more random.

Slave to Master Latency Reduction

To get adequate error coverage from the CRC while minimizing impact on bus efficiency, the data may be grouped in blocks over which the CRC is calculated. On a transfer from slave device 110 to master controller 105, the correctness of the data in the block cannot be established until all of the data block and the CRC have been received. However, this increases the latency for the first portion of the block which might be a critical word for forward progress in the system.

Figure 5:
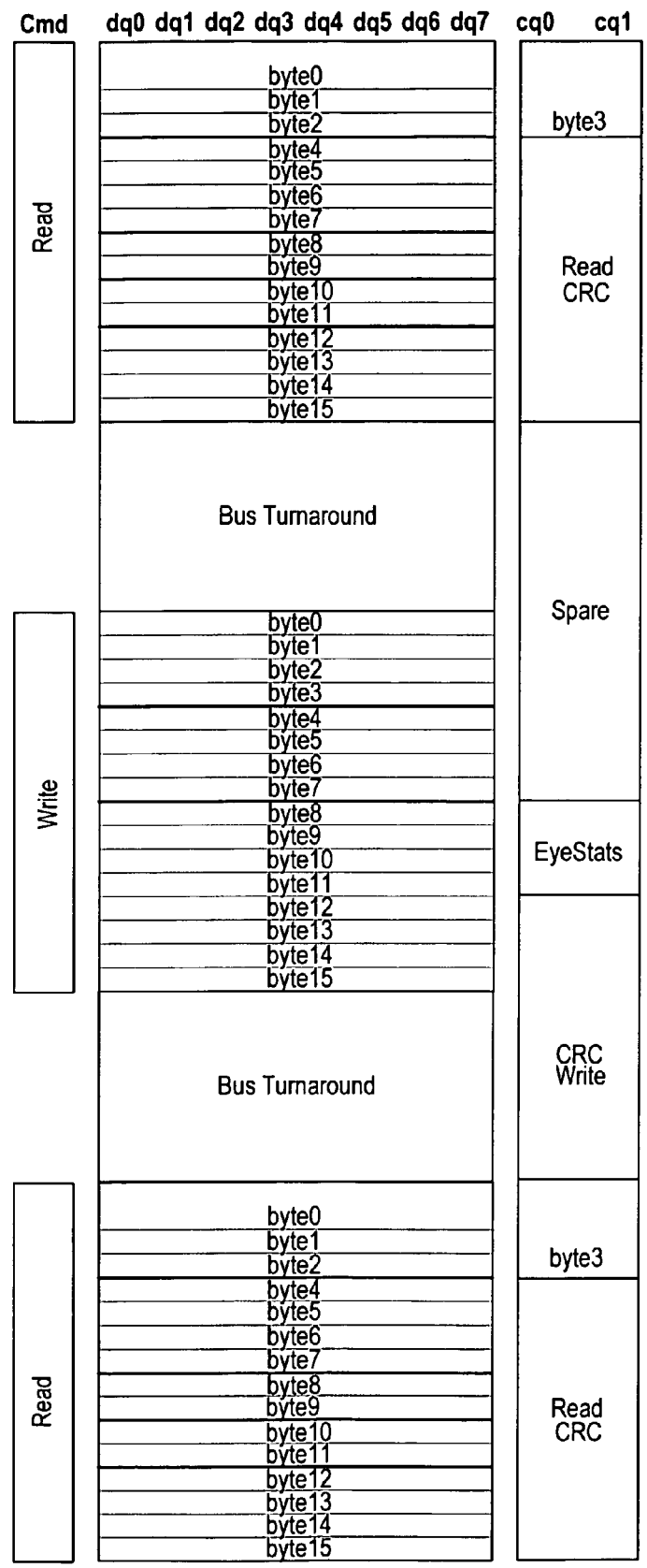
FIG. 5 is a diagram illustrating an embodiment of an exemplary encoding across a byte group.

Referring to FIG. 5, a diagram illustrating an exemplary encoding across a byte group is shown. In one embodiment, the critical word may be additionally protected by including an additional in-line-error code that is inserted between the critical word and the rest of the block. For example, as shown in FIG. 5, the additional error detection information may be implemented by repeating the critical word (e.g., byte 0) at the beginning of the block. By sending the critical word twice, master controller 105 may validate that each bit is identical between the two copies and substantially lower the error rate for the critical word, thus allowing the critical word to be treated as valid before the complete CRC for the block has been received. Said in another way, during a read operation, slave device 110 may send the critical word during the first two beats or bit times of the read block.

In the embodiment shown in FIG. 5, two CRC signal paths protect 8 data paths using a burst of 16 bits. To allow room for two copies of the critical word, byte 3 is output on the CRC paths during the first four beats of the read block. This also allows the read CRC to be calculated after the delivery of the critical word. On a write, the CRC calculation takes longer and so 12 bit times are allowed for this calculation and the overlap on a write-to-read turn around occurs in the bus turnaround delay. It is noted that the CRC does not change direction between reads and writes. As shown, this encoding may provide some additional bandwidth that may be used to output write data eye statistics. It is also noted that when there are more than one slave device, it may be necessary to insert a gap (i.e., bubble) when master controller 105 controller changes the slave device to which it is reading or writing.

Skew Management Across a Byte Group

To reduce the complexity in slave device 110 and master controller 105 the skew between data paths in a byte group can be controlled in the design of the slave device 110, master controller 105 and the PCB routing. In one embodiment, the maximum skew between bits within a byte group may be controlled to within 0.1 UI at 3.2 Gb/s which allows the different data paths in the group to be treated the same for equalization.

By controlling the skew in this manner, the noise generated by simultaneously switching output (SSO) may be aligned accurately at the received data eye edge, thereby minimizing its impact on eye closure. However this may not provide any relief for SSO affects on the master controller receive CRC data while it is transmitting and so additional burden may be placed on the master to correctly receive the resulting smaller data eye. However, this may be mitigated by the master controller having an external reference voltage for its input receivers that is internally terminated and referenced to signal ground of the CRC receive bits. By doing so, the SSO noise may be converted to common mode noise and thus rejected by the input receiver for the CRC bits.

Byte Mode Writes to Memory

Figure 6:
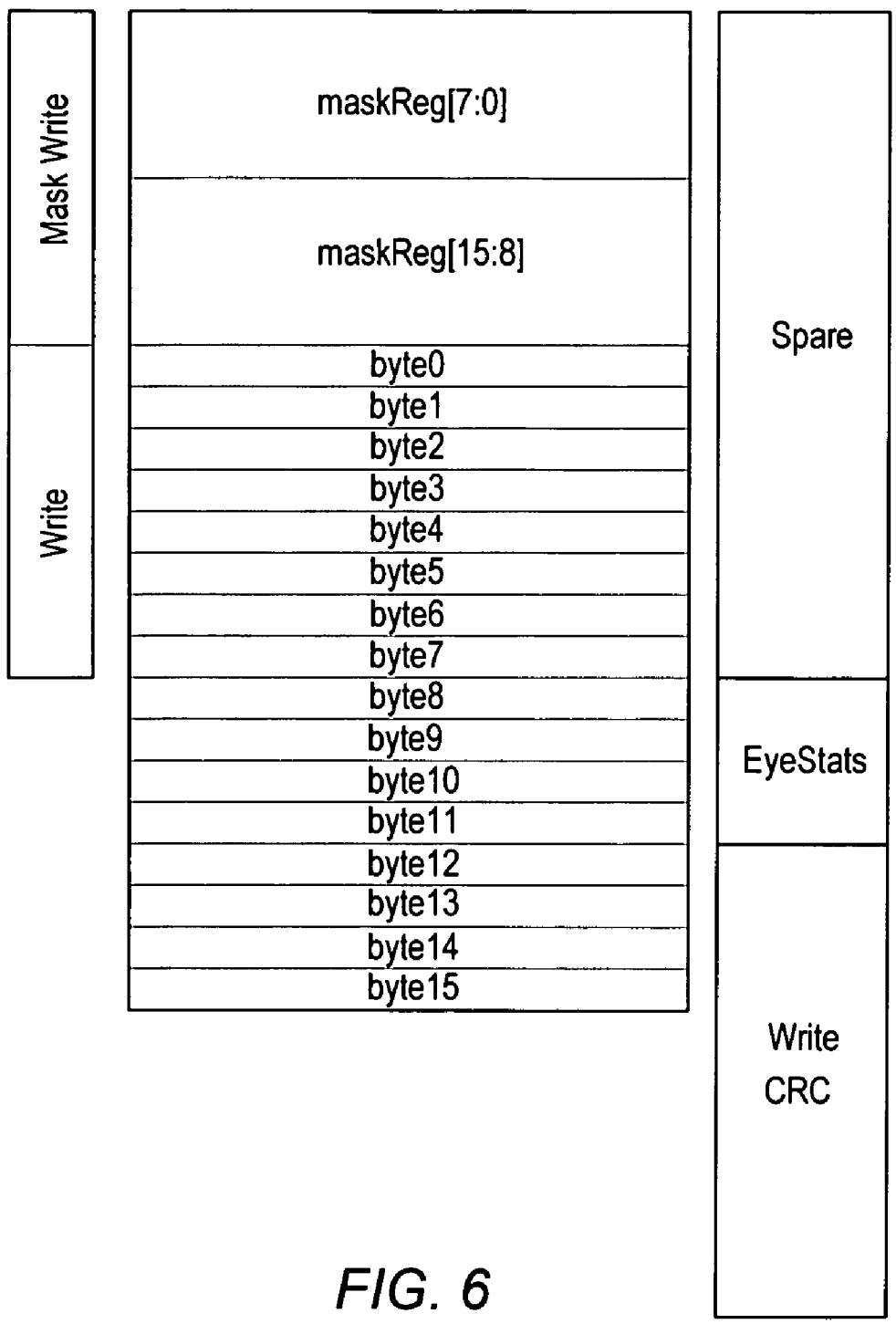
FIG. 6 is a diagram illustrating an embodiment of an encoding of a masked write operation.

In some memory applications, it may be desirable to support a byte write feature between a memory controller and a memory device to avoid a read/modify/write operation on a burst-oriented transaction. As such, in embodiments in which master controller 105 is a memory controller and slave device 110 is a memory device, byte writes may be implemented using a masked writes. Referring to FIG. 6, a diagram illustrating an embodiment of a masked write operation is shown. The additional bandwidth for the mask write is accomplished by preceding the write data payload with a short burst of eight bits that contains the mask information.

Since master controller 105 will not generally know the contents of the memory that is not to be modified, a bit error in the mask information could cause data in memory to be incorrectly modified. To overcome this problem, master controller 105 transmits the mask information for four consecutive bit times and slave device 110 uses the third bit time to sample the data. More particularly, in one embodiment, the third bit time is guaranteed to be stable by device specification. However, it is noted that in other embodiments, mask information may be transmitted for other numbers of consecutive bit times. As such, other bit times may be guaranteed to be stable and slave device 110 may use the stable bit time to sample the data.

Single Ended Switching I/O Topology

Figure 7:
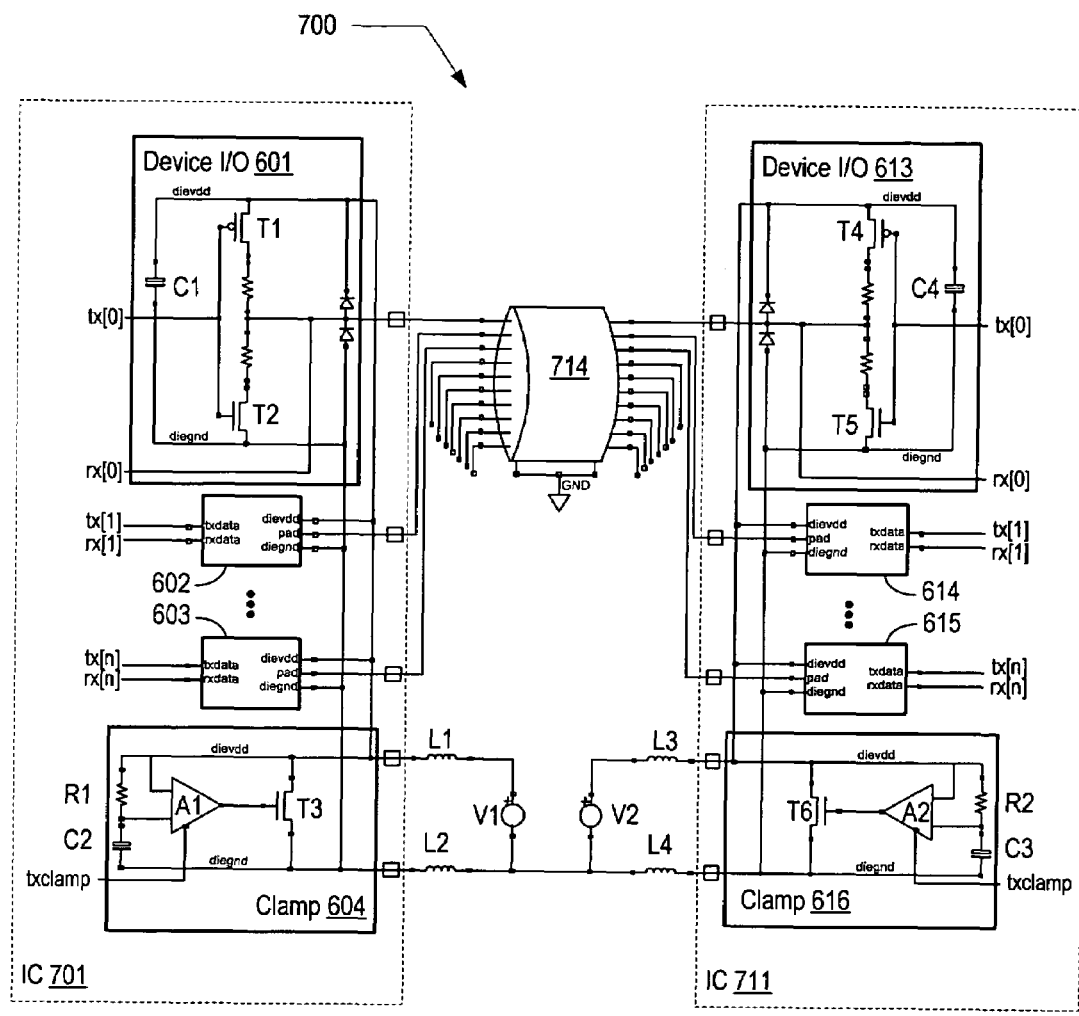
FIG. 7 is a diagram of one embodiment of a single ended switching bi-directional signaling scheme.

FIG. 7 is a diagram of one embodiment of a system employing a single ended switching bi-directional signaling scheme. In the case of single ended switching signaling schemes such as the system of FIG. 1, minimization of pad I/O capacitance and control of on-die VDD are critical design parameters. A simple voltage mode transmitter and receiver terminator combined with a dynamically controlled on-die shunt regulator may provide a good compromise between power consumption and a simplified I/O structure.

Accordingly, system 700 includes an integrated circuit (IC) device 701 coupled to an IC device 711 via a bus 114 including a plurality of bidirectional signal paths. For each of the bidirectional signal paths 714, IC 701 includes a driver circuit coupled to the signal path. As shown in FIG. 7, exemplary driver circuits are shown as device I/O 601, 602, and 603, although only the detailed aspects of device I/O 601 are shown for simplicity. As such, device I/O 601 embodies a complimentary metal oxide semiconductor (CMOS) driver circuit that includes transistors T1 and T2. The tx[0] input is coupled to the input of the driver circuit. The output is coupled to the a signal path of bus 714 and to the receive signal path rx[0]. It is noted that driver circuits 602 and 603 may include substantially the same circuit as device I/O 601.

In the illustrated embodiment, device I/O 601 is a voltage mode driver having a voltage swing of approximately VDD/2 into a transmission line (e.g., signal path of 714) terminated by an substantially equivalent driver (e.g., device I/O 613), which drives the die-pad to ground, thereby terminating the receiver to ground. It is noted that in the illustrated embodiment, the supply voltages for the two IC devices (chips) may be different voltages such as 1.5 v and 1.0 v, for example.

IC 701 also includes a dynamically controlled shunt regulator circuit, designated clamp 604 that detects transitions in the on-die VDD that go above the average DC voltage. In addition a power delivery loop including inductors L1, L2 and voltage source V1 is shown. It is noted that the inductors L1 and L2 are representative of a model of intrinsic inductances that may be due to packaging, lead length, etc, and voltage source V1 is representative of a model of the VDD supply.

When the on-die VDD transitions go above the average DC voltage, the amplifier A1 turns on transistor T3, which sustains the current flow through the inductive power delivery loop (e.g., L1, V1, L2). This effectively clamps the positive voltage overshoot. This clamping in combination with transmitting scrambled data (as described above), may reduce the on-die VDD noise by more than 50% in some embodiments. To minimize noise during bus turn-around (e.g., write-to-read and read-to-write transitions) in response to the (txclamp) signal, the clamp transistor T3 may be turned on for a short period prior to enabling the transmitter switching. This may pull current from the on-die VDD decoupling capacitor C1, which may in turn start increasing the current flowing through the power delivery loop. The clamp transistor T3 may be turned off prior to the first bit being transmitted which may cause an inductive ring of the on-die VDD, which may cause the shunt regulator 604 to clamp, thereby ensuring a negligible on-die VDD drop as the transmitter starts up.

As shown, IC device 711 includes substantially identical circuits and therefore operates substantially the same as IC device 701. Accordingly, the operation of IC device 711 is not described further for brevity.

It is noted that the average power of the switching I/O may not be significantly altered by this technique, whereas a driver that draws constant current from the supply for driving a 1 or 0 could consume approximately twice the average switching power.

It is noted that the IC 701 and IC 711 shown in FIG. 7 may be illustrative of any two devices that may employ a bi-directional signaling scheme between two chips. However in one embodiment, IC 701 and IC 711 may be representative of the master controller 105 and slave device 110 depicted in the embodiments described above in conjunction with the descriptions of FIG. 1 through FIG. 6.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A system comprising:
   a device coupled to a plurality of bidirectional signal paths, wherein the device includes:
   a plurality of voltage mode driver circuits each coupled to a respective signal path of the plurality of bidirectional signal paths, wherein each of the plurality of driver circuits is configured to source a voltage when transmitting data and to a terminate a respective signal path to a ground reference when receiving data; and
   a shunt regulator circuit coupled to a voltage supply of the device and configured to provide a current shunt from the voltage source to the ground reference in response to detecting a transition on the voltage supply in which the voltage increases above an average DC voltage;
   wherein the shunt regulator is configured to detect the transition on the voltage supply at a node between a resistor coupled to the supply voltage and a capacitor coupled to the ground reference.

2. The system as recited in claim 1, wherein the shunt regulator includes a transistor coupled between the voltage supply and the ground reference, wherein the transistor provides the current shunt when conducting.

3. The system as recited in claim 1, further comprising a second device coupled to the plurality of bidirectional signal paths, wherein the second device includes a second shunt regulator circuit coupled to a voltage supply of the second device, wherein the second shunt regulator is configured to provide a current shunt from the voltage source to the ground reference in response to detecting a transition on the voltage supply in which the voltage increases above an average DC voltage.

4. The system as recited in claim 3, wherein the second device further comprises a second plurality of voltage mode driver circuits, one for each signal path of the plurality of bidirectional signal paths, wherein each circuit of the second plurality of driver circuits is configured to be a voltage source when transmitting data and a termination to the ground reference when receiving data.

5. The system as recited in claim 4, wherein the second shunt regulator is further configured to provide a current shunt from the voltage source to the ground reference in response to receiving a signal indicating that one or more of the voltage mode driver circuits are enabled to transmit data.

6. A system comprising:
   a device coupled to a plurality of bidirectional signal paths, wherein the device includes:
   a plurality of voltage mode driver circuits each coupled to a respective signal path of the plurality of bidirectional signal paths, wherein each of the plurality of driver circuits is configured to source a voltage when transmitting data and to a terminate a respective signal path to a ground reference when receiving data; and
   a shunt regulator circuit coupled to a voltage supply of the device and configured to provide a current shunt from the voltage source to the ground reference in response to detecting a transition on the voltage supply in which the voltage increases above an average DC voltage;
   wherein the shunt regulator is further configured to provide a current shunt from the voltage source to the ground reference in response to receiving a clamp signal prior to one or more of the voltage mode driver circuits being enabled to transmit data.

7. The system as recited in claim 6, wherein the shunt regulator is further configured to remove the current shunt in response to removal of the signal indicating that one or more of the voltage mode driver circuits are ready to transmit data.

8. A memory system comprising:
   a memory controller;
   a memory device coupled to the memory controller via a plurality of bidirectional signal paths;
   wherein the memory controller and the memory device each include:
   a plurality of voltage mode driver circuits each coupled to a respective signal path of the plurality of bidirectional signal paths, wherein each of the plurality of driver circuits is configured to source a voltage when transmitting data and to a terminate a respective signal path to a ground reference when receiving data; and
   a shunt regulator circuit coupled to a respective voltage supply of each of the memory controller and the memory device, and configured to provide a current shunt from the voltage source to the ground reference in response to detecting a transition on the voltage supply in which the voltage increases above an average DC voltage;
   wherein the shunt regulator is configured to detect the transition on the voltage supply at a node between a resistor coupled to the supply voltage and a capacitor coupled to the ground reference.

9. The system as recited in claim 8, wherein the shunt regulator includes a transistor coupled between the voltage supply and the ground reference, wherein the transistor provides the current shunt when conducting.

10. The system as recited in claim 8, further comprising a second device coupled to the plurality of bidirectional signal paths, wherein the second device includes a second shunt regulator circuit coupled to a voltage supply of the second device, wherein the second shunt regulator is configured to provide a current shunt from the voltage source to the ground reference in response to detecting a transition on the voltage supply in which the voltage increases above an average DC voltage.

11. The system as recited in claim 10, wherein the second device further comprises a second plurality of voltage mode driver circuits, one for each signal path of the plurality of bidirectional signal paths, wherein each circuit of the second plurality of driver circuits is configured to be a voltage source when transmitting data and a termination to the ground reference when receiving data.

12. The system as recited in claim 11, wherein the second shunt regulator is further configured to provide a current shunt from the voltage source to the ground reference in response to receiving a signal indicating that one or more of the voltage mode driver circuits are enabled to transmit data.

13. A memory system comprising:
a memory controller;
a memory device coupled to the memory controller via a plurality of bidirectional signal paths;
wherein the memory controller and the memory device each include:
a plurality of voltage mode driver circuits each coupled to a respective signal path of the plurality of bidirectional signal paths, wherein each of the plurality of driver circuits is configured to source a voltage when transmitting data and to a terminate a respective signal path to a ground reference when receiving data; and
a shunt regulator circuit coupled to a respective voltage supply of each of the memory controller and the memory device, and configured to provide a current shunt from the voltage source to the ground reference in response to detecting a transition on the voltage supply in which the voltage increases above an average DC voltage;
wherein the shunt regulator is further configured to provide a current shunt from the voltage source to the ground reference in response to receiving a clamp signal prior to one or more of the voltage mode driver circuits being enabled to transmit data.

14. The system as recited in claim 13, wherein the shunt regulator is further configured to remove the current shunt in response to removal of the signal indicating that one or more of the voltage mode driver circuits are ready to transmit data.

15. A method of conveying signals between a first device and a second device via a plurality of bidirectional signal paths, the method comprising:
sourcing a voltage when transmitting data and terminating a respective signal path of the plurality of bidirectional signal paths to a ground reference when receiving data;
providing a current shunt from a respective voltage source of each of the first device and the second device to the ground reference in response to detecting a transition on a respective voltage supply in which the voltage supply increases above an average DC voltage; and
providing the current shunt from the voltage source to the ground reference in response to receiving a clamp signal prior to transmitting data.

16. The method as recited in claim 15, further comprising detecting the transition on the respective voltage supply at a node between a resistor coupled to the voltage supply and a capacitor coupled to the ground reference.

17. The method as recited in claim 15, further comprising removing the current shunt in response to removal of the clamp signal indicating that one or more voltage mode driver circuits are ready to transmit data.

* * * * *